(12) United States Patent
Jeong et al.

(10) Patent No.: US 8,168,530 B2
(45) Date of Patent: *May 1, 2012

(54) METHODS OF FORMING ONE TRANSISTOR DRAM DEVICES

(75) Inventors: Jae-Hun Jeong, Gyeonggi-do (KR); Ki-Nam Kim, Seoul (KR); Soon-Moon Jung, Gyeonggi-do (KR); Jae-Hoon Jang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 68 days.

This patent is subject to a terminal disclaimer.

(21) Appl. No.: 12/842,703

(22) Filed: Jul. 23, 2010

(65) Prior Publication Data

US 2010/0330752 A1 Dec. 30, 2010

Related U.S. Application Data

(63) Continuation of application No. 12/024,459, filed on Feb. 1, 2008, now Pat. No. 7,795,651.

(30) Foreign Application Priority Data

Feb. 2, 2007 (KR) .................................. 2007-11085

(51) Int. Cl.
*H01L 21/4763* (2006.01)
(52) U.S. Cl. ................ 438/622; 438/618; 257/E27.084; 257/E27.085; 257/E21.646; 257/E21.614; 257/758
(58) Field of Classification Search ........... 257/E27.026, 257/E27.085, E27.084, E23.145, E21.646, 257/E21.614, 278, 74, 758; 438/618, 622
See application file for complete search history.

(56) References Cited

U.S. PATENT DOCUMENTS

| 5,573,961 | A | * | 11/1996 | Hsu et al. | ....................... 438/163 |
| 6,153,933 | A | * | 11/2000 | Chan et al. | .................... 257/752 |
| 7,081,653 | B2 | | 7/2006 | Kawanaka | |
| 2006/0120148 | A1 | * | 6/2006 | Kim et al. | ....................... 365/163 |
| 2006/0246709 | A1 | * | 11/2006 | Kim et al. | ....................... 438/618 |

FOREIGN PATENT DOCUMENTS

| JP | 2003-188279 | 7/2003 |
| KR | 1020030051299 A | 6/2003 |
| KR | 1020040086345 A | 8/2004 |
| KR | 1020060047467 A | 5/2006 |
| KR | 100630760 B1 | 9/2006 |
| KR | 1020060104794 A | 9/2006 |
| KR | 1020080008909 A | 1/2008 |

* cited by examiner

*Primary Examiner* — Nathan W. Ha
*Assistant Examiner* — Yu-Hsi D Sun
(74) *Attorney, Agent, or Firm* — Myers Bigel Sibley & Sajovec, P.A.

(57) ABSTRACT

A one transistor DRAM device includes: a substrate with an insulating layer, a first semiconductor layer provided on the insulating layer and including a first source region and a first region which are in contact with the insulating layer and a first floating body between the first source region and the first drain region, a first gate pattern to cover the first floating body, a first interlayer dielectric to cover the first gate pattern, a second semiconductor layer provided on the first interlayer dielectric and including a second source region and a second drain region which are in contact with the first interlayer dielectric and a second floating body between the second source region and the second drain region, and a second gate pattern to cover the second floating body.

7 Claims, 21 Drawing Sheets

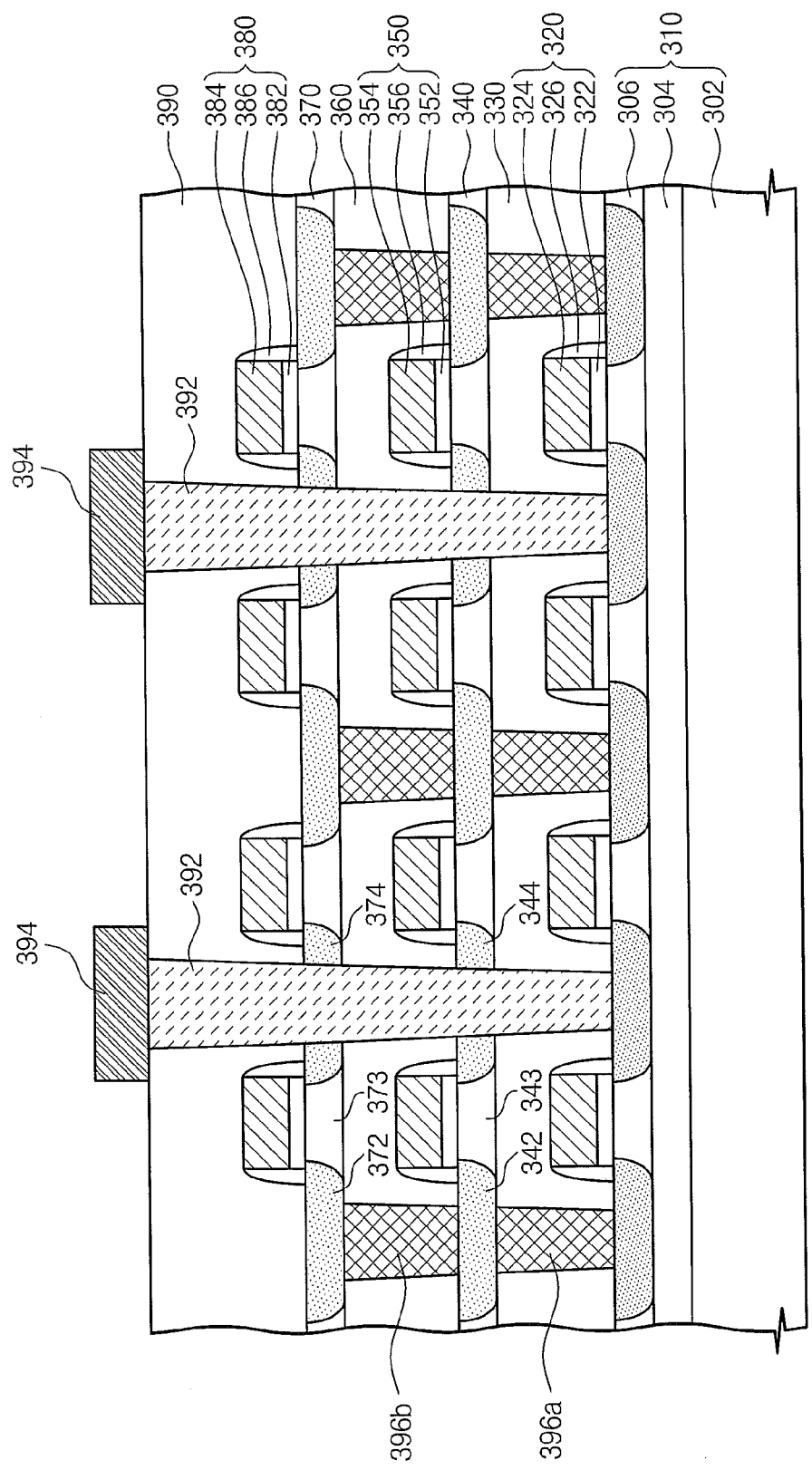

METHODS OF FORMING ONE TRANSISTOR DRAM DEVICES

REFERENCE TO RELATED APPLICATIONS

This application is a continuation of U.S. patent application Ser. No. 12/024,459 (now U.S. Pat. No. 7,795,651), filed Feb. 1, 2008, which claims priority to Korean Patent Application 10-2007-011085, filed Feb. 2, 2007, the contents of which are hereby incorporated herein by reference.

BACKGROUND

The present invention relates to semiconductor devices and methods of forming the same. More specifically, the present invention is directed to a one transistor DRAM device and a method of forming the same.

The semiconductor device includes a non-volatile memory such as a DRAM. Typically, a unit cell of a DRAM includes one transistor and one capacitor. The difficulty level of a process of forming capacitors having the same capacitance is increasing with the recent trend toward higher integration density of semiconductor devices.

A variety of attempts have been made to overcome the increasing difficulty level of the process. One of these attempts is to develop a one transistor DRAM cell structure where there is one transistor and no capacitor. That is, the one transistor DRAM cell is advantageous in achieving a high integration density because there is no capacitor.

Referring to FIG. 1, a conventional one transistor DRAM cell is formed on a semiconductor substrate 10 including a filling insulating layer 11. A source region 14, a floating body 13, and a drain region 15 are provided on the filling insulating layer 11. A gate insulator 16 and a gate pattern 18 are sequentially provided on the floating body 13. The source region 14, the drain region 15, and the gate pattern 18 are connected to a ground, a bitline, and a wordline, respectively. The floating body 15 is electrically isolated by the filling insulating layer 11, the gate insulator 16, the source region 14, and the drain region 15. The one transistor DRAM cell can store and read data using the floating body effect.

A write operation of the one transistor DRAM cell, i.e., a data storing method is now described. The source region 14 is grounded. A wordline voltage higher than a threshold voltage is applied to the gate pattern 18. A bitline program voltage is applied to the drain region 15. The write operation includes generating holes at the floating body 13 in the vicinity of the drain region 15. The holes are accumulated in the floating body 13. The accumulated holes result in fluctuation of the threshold voltage.

A read operation of the one transistor DRAM cell, i.e., a data reading method is now described. The source region 14 is grounded. A wordline read voltage lower than the wordline program voltage is applied to the gate pattern 18. A bitline read voltage is applied to the drain region 15. The amount of current flowing between the source region 14 and the drain region 15 varies depending on whether there are holes. That is, the amount of current flowing between the source region 14 and the drain region 15 is detected to read data stored in the one transistor DRAM cell. In addition, the threshold voltage varies with the amount of the accumulated holes.

SUMMARY OF THE INVENTION

Exemplary embodiments of the present invention provide a one transistor DRAM device. In an exemplary embodiment, the one transistor DRAM device may include: a substrate with an insulating layer; a first semiconductor layer provided on the insulating layer and including a first source region and a first region which are in contact with the insulating layer and a first floating body between the first source region and the first drain region; a first gate pattern to cover the first floating body; a first interlayer dielectric to cover the first gate pattern; a second semiconductor layer provided on the first interlayer dielectric and including a second source region and a second drain region which are in contact with the first interlayer dielectric and a second floating body between the second source region and the second drain region; and a second gate pattern to cover the second floating body.

Exemplary embodiments of the present invention provide a method of forming a one transistor DRAM device. In an exemplary embodiment, the method may include: preparing a substrate with an insulating layer and a first semiconductor layer; forming a first gate pattern on the first semiconductor layer; forming a first source region and a first drain region and a first floating body in the first semiconductor layer adjacent to the first gate pattern, the first source region and the first drain region being in contact with the insulating layer and the first floating body being between the first source region and the first drain region; forming a first interlayer dielectric to cover the first gate pattern; forming a second semiconductor layer on the first interlayer dielectric; forming a second gate pattern on the second semiconductor layer; and forming a second source region and a second drain region and a second floating body in the second semiconductor layer adjacent to the second gate pattern, the second source region and the second drain region being in contact with the first interlayer dielectric and the second floating body being between the second source region and the second drain region, wherein the first gate pattern and the second gate pattern are formed on the first floating body and the second floating body, respectively.

BRIEF DESCRIPTION OF THE DRAWINGS

FIGS. 10A through 10D are cross-sectional views illustrating a method of forming one transistor DRAM device according to a modified embodiment of the present invention.

DETAILED DESCRIPTION OF PREFERRED EMBODIMENTS

Figure 1:
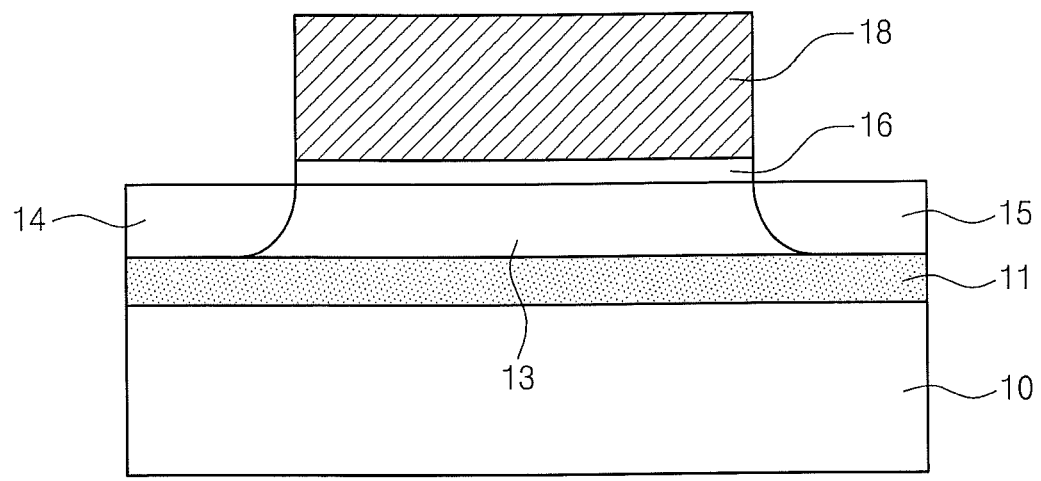
FIG. 1 is a cross-sectional view of a conventional one transistor DRAM device.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 2:
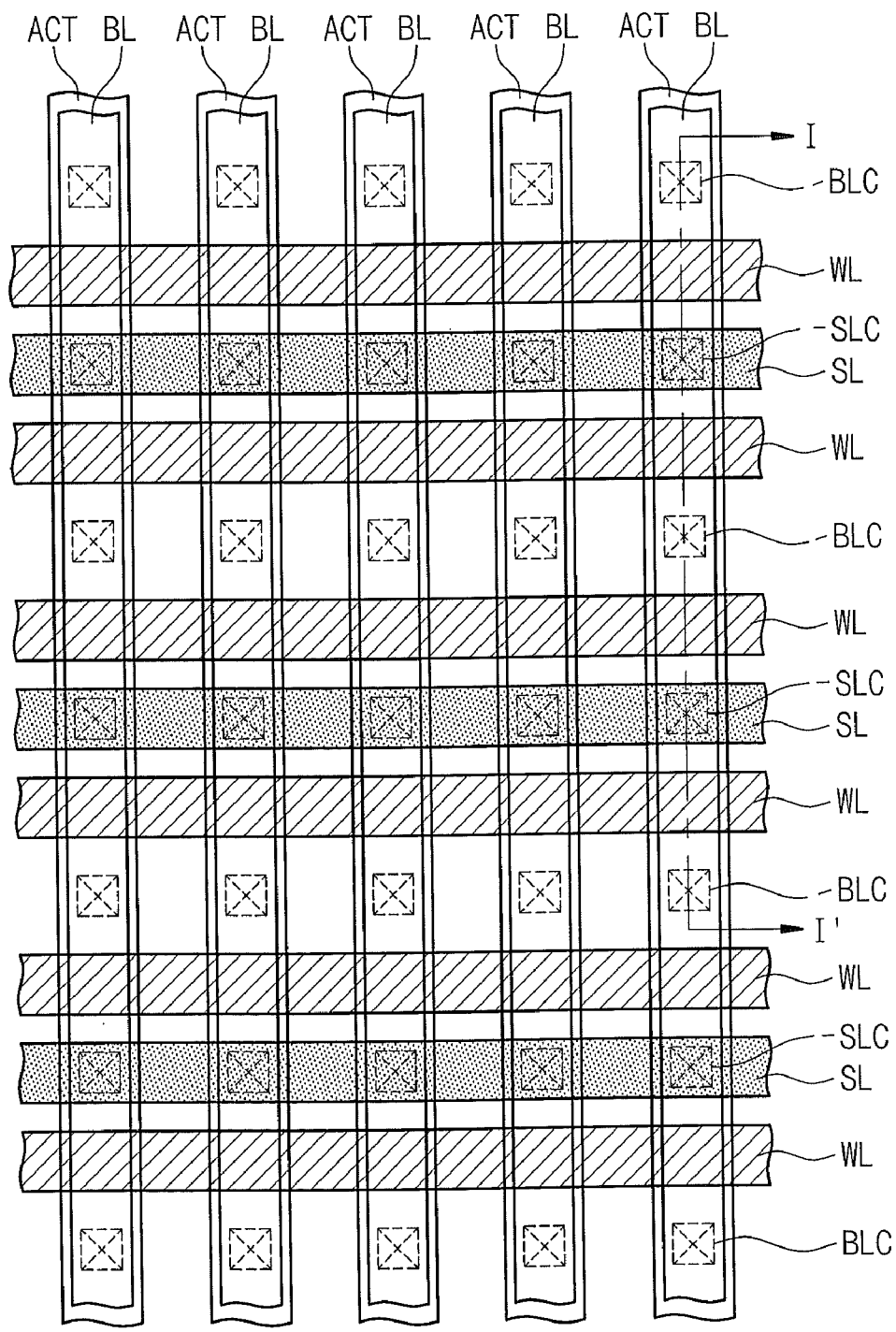
FIG. 2 is a top plan view of a one transistor DRAM device according to an embodiment of the present invention.
Figure 3:
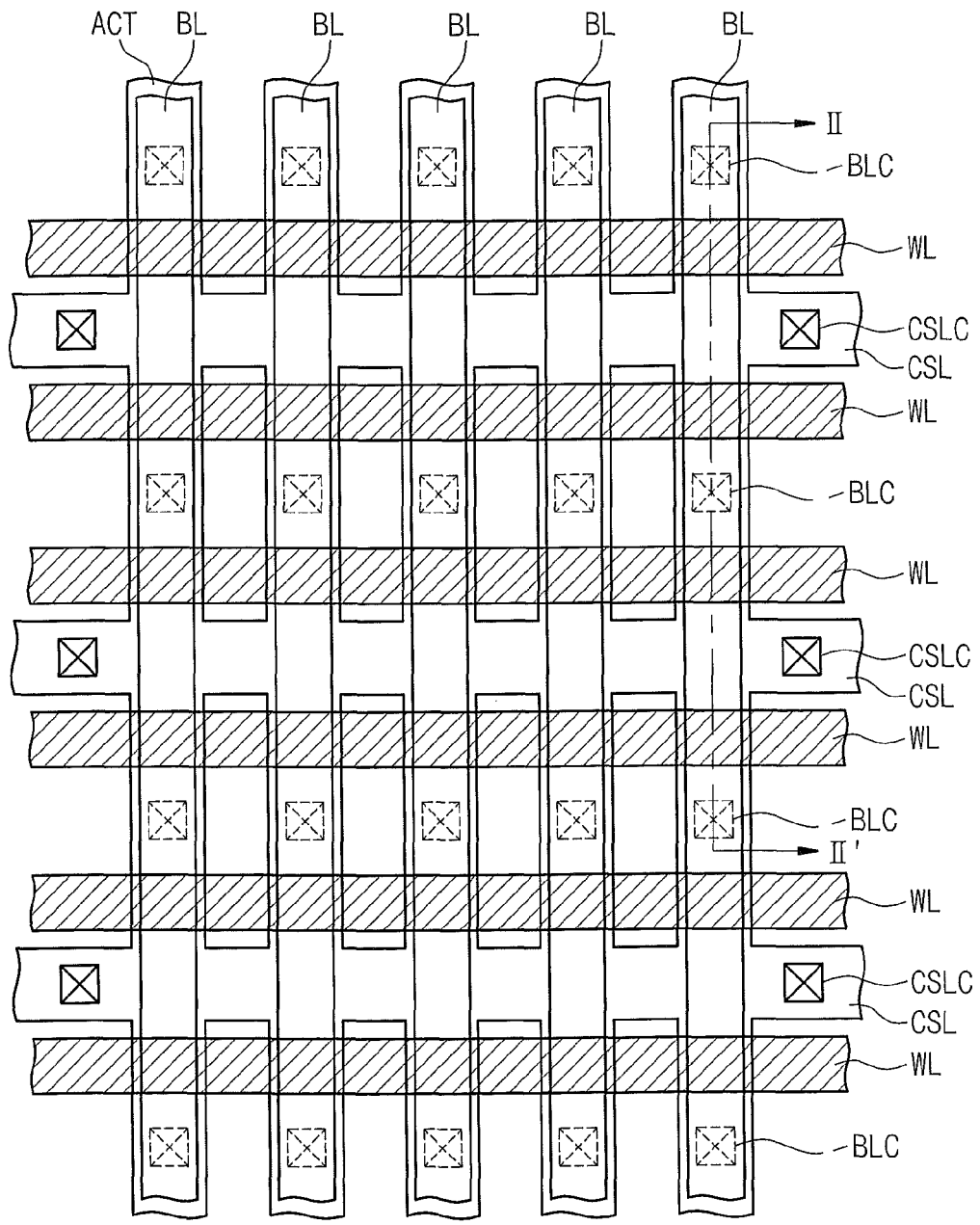
FIG. 3 is a top plan view of a one transistor DRAM device according to another embodiment of the present invention.

FIGS. 2 and 3 are top plan views of one transistor DRAM devices according to embodiments of the present invention, respectively. Referring to FIG. 2, active regions ACT are defined on a semiconductor substrate. The active regions ACT may be arranged in one direction to be parallel with each other. Wordlines WL are arranged to cross over the active regions ACT. A source region and a drain region are formed in the semiconductor substrate adjacent to the wordlines WL. The source region is connected to a source line SL by a source line contact SLC. The source line SL may be disposed in a parallel direction to the wordline WL. The drain region is connected to a bitline BL by a bitline contact BLC. The bitline BL may be disposed in a cross direction to the source line SL.

Referring to FIG. 3, wordlines WL, bitlines BL, and a bitline contact BLC are arranged, as described above in FIG. 2. Unlike FIG. 2, adjacent source regions may be connected by an active region ACT to exhibit a linear shape. The linear source regions may constitute a common source line CSL. The common source line CSL is provided, so that a source line contact SLC may be unnecessary for the respective source regions. A common source line contact CSLC may be connected to the common source line CSL.

Figure 4:
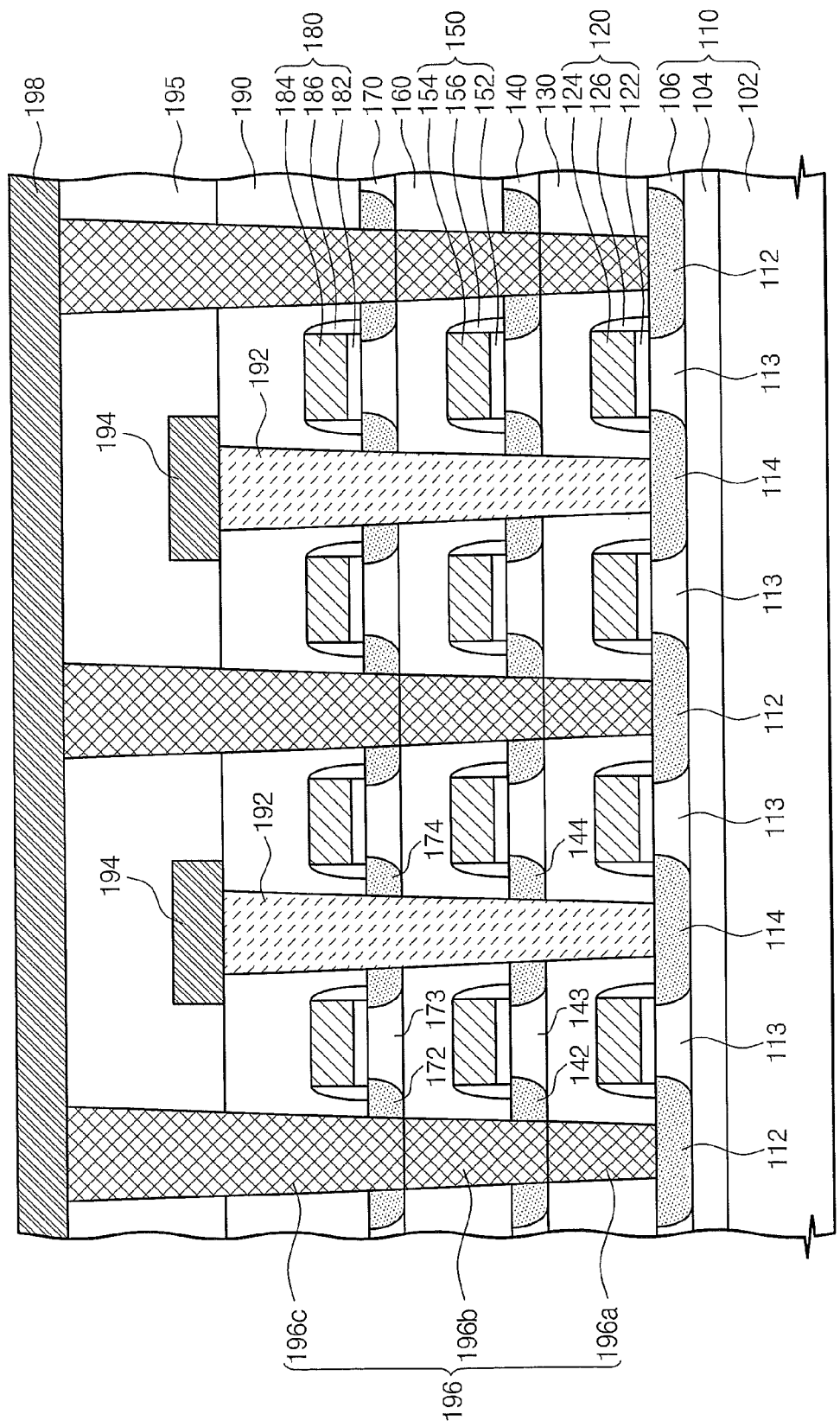
FIG. 4 is a cross-sectional view of a one transistor DRAM device according an embodiment of the present invention.

FIG. 4 is a cross-sectional view, taken along a line I-I' of FIG. 2, illustrating a one transistor DRAM device according to an embodiment of the present invention. Referring FIG. 4, a semiconductor substrate 110 is provided with a filling insulating layer 104. The semiconductor substrate 110 may be a silicon on insulator (SOI) substrate. The semiconductor substrate 110 may include a support substrate 102 and a first semiconductor layer 106 on the filling insulating layer 104. A first source region 114 and a first drain region 112 are provided in the first semiconductor layer 106 to be in contact with the filling insulating layer 104. A floating body 113 is provided between the first source region 114 and the first drain region 112. A first gate pattern 120 is provided to cover the first floating body 113. The first gate pattern 120 may include a first gate insulator 122, a first gate electrode 124, and a first spacer 126. A first interlayer dielectric 130 is provided to cover the first gate pattern 120.

A second semiconductor layer 140 is provided on the first interlayer dielectric 130. Similar to the first semiconductor layer 106, the second semiconductor layer 140 may include a second source region 144, a second drain region 142, and a second floating body 143. A second gate pattern 150 is provided to cover the second floating body 143. The second gate pattern 150 may include a second gate insulator 152, a second gate electrode 154, and a second spacer 156. A second interlayer dielectric 160 is provided to cover the second gate pattern 150. A third semiconductor layer 170 is provided on the second interlayer dielectric 160. The third semiconductor layer 170 may include a third source region 174, a third drain region 172, and a third floating body 173. A third gate pattern 180 is provided to cover the third floating body 173. The third gate pattern 180 may include a third gate insulator 182, a third gate electrode 184, and a third spacer 186. A third interlayer dielectric 190 is provided to cover the third gate pattern 180.

A source line contact 192 is provided through the third interlayer dielectric 190, the second interlayer dielectric 160, and the first interlayer dielectric 130 to connect the third source region 174, the second source region 144, and the first source region 114. A source line 194 is provided on the third interlayer dielectric 190 to be connected to the source line contact 192. A fourth interlayer dielectric 195 is provided to cover the source line 194. A bitline contact 196 is provided through the fourth interlayer dielectric 195, the third interlayer dielectric 190, the second interlayer dielectric 160, and the first interlayer dielectric 130 to connect the second drain region 142 and the third drain region 172.

The bitline contact 196 may include a first bitline contact 196a, a second bitline contact 196b, and a third bitline contact 196c. The first bitline contact 196a is in contact with the first drain region 112 through the first interlayer dielectric 130. The second bitline contact 196b is in contact with the first bitline contact 196a through the second interlayer dielectric 160 and the second drain region 142. The third bitline contact 196c is in contact with the second bitline contact 196b through the third interlayer dielectric 190 and the third drain region 172. A bitline 198 is provided on the fourth interlayer dielectric 195 to be connected to the bitline contact 196. The bitline 198 may be provided in a cross direction to the source line 194. In an embodiment of the present invention, integration density of a one transistor DRAM device may be enhanced by stacking the one transistor DRAM device.

Figure 5:
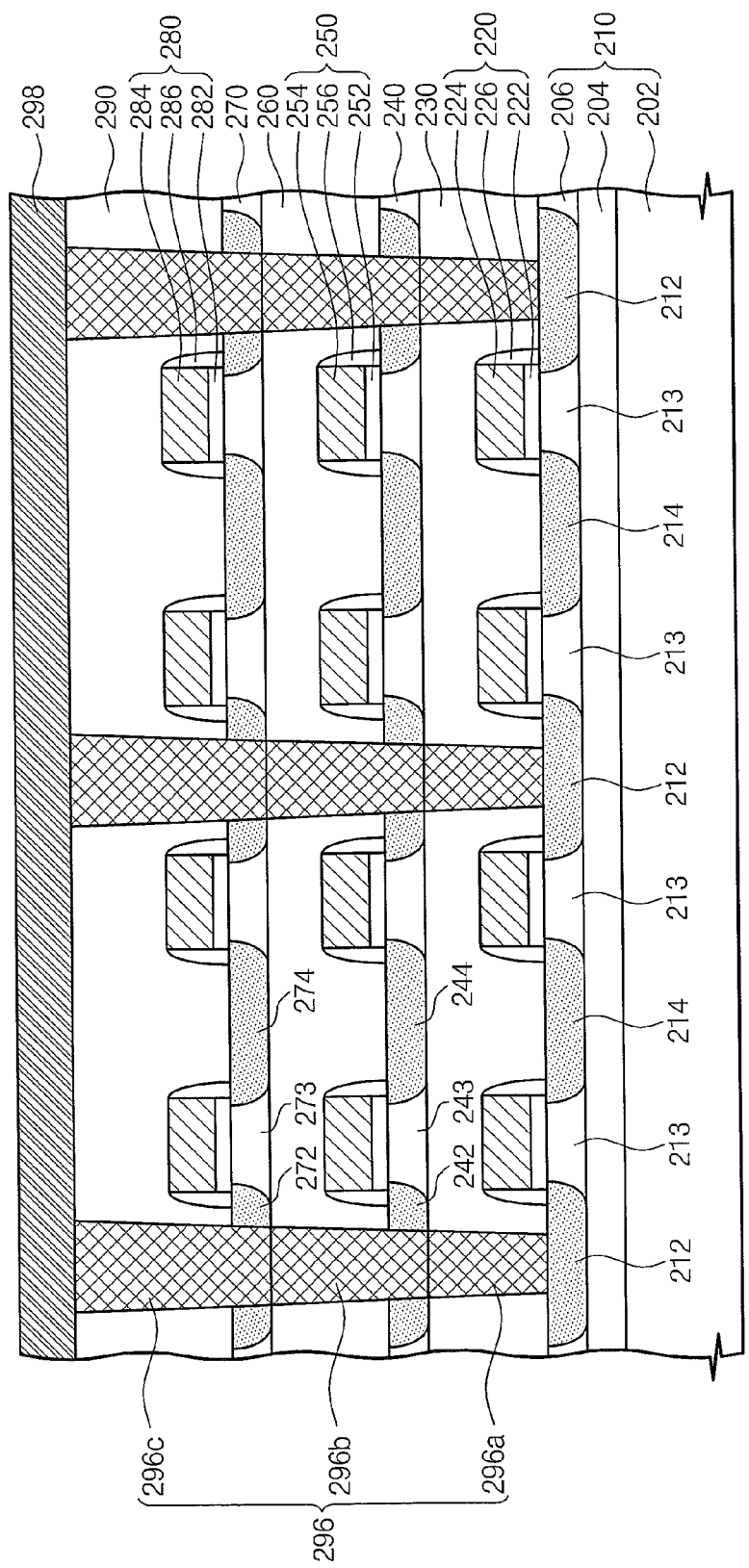
FIG. 5 is a cross-sectional view of a one transistor DRAM device according to another embodiment of the present invention.

FIG. 5 is a cross-sectional view, taken along a line II-II' of FIG. 3, illustrating a one transistor DRAM device according to another embodiment of the present invention. Referring to FIG. 5, a semiconductor substrate 210 is provided with a filling insulating layer 204. The semiconductor substrate 210 may be a silicon on insulator (SOI) substrate. The semiconductor substrate 210 may include a support substrate 202 and a first semiconductor layer 206 on the filling insulating layer 204. A first source region 214 and a drain region 212 are provided in the first semiconductor layer 206 to be in contact with the filling insulating layer 204. A first floating body 213 is provided between the first source region 214 and the first drain region 212. A first gate pattern 220 is provided to cover the first floating body 213. The first gate pattern 220 may include a first gate insulator 222, a first gate electrode 224, and a first spacer 226. A first interlayer dielectric 230 is provided to cover the first gate pattern 220.

A second semiconductor layer 240 is provided on the first interlayer dielectric 230. Similar to the first semiconductor layer 206, the second semiconductor layer 240 may include a second source region 244, a second drain region 242, and a second floating body 243. A second gate pattern 250 is provided to cover the second floating body 243. The second gate pattern 250 may include a second gate insulator 252, a second gate electrode 254, and a second spacer 256. A second interlayer dielectric 260 is provided to cover the second gate pattern 250. A third semiconductor layer 270 is provided on the second interlayer dielectric 260. The third semiconductor layer 270 may include a third source region 274, a third drain region 272, and a third floating body 273. A third gate pattern 280 is provided to cover the third floating body 273.

The first source region 214, the second source region 244, and the third source region 274 are connected along an active region to exhibit a linear shape. The linear first, second, and third source regions 214, 244, and 274 may constitute common source lines CSL. The third gate pattern 280 may include a third gate insulator 282, a third gate electrode 284, and a third spacer 286. A third interlayer dielectric 290 is provided to cover the third gate pattern 280.

A bitline contact 296 is provided through the third interlayer dielectric 290, the second interlayer dielectric 260, and the first interlayer dielectric 230 to connect the first drain region 212, the second drain region 242, and the third drain region 272. The bitline contact 296 may include a first bitline contact 296a, a second bitline contact 296b, and a third bitline contact 296c. The first bitline contact 296a is in contact with the first drain region 212 through the first interlayer dielectric 230. The second bitline contact 296b is in contact with the first bitline contact 296a through the second interlayer dielectric 260 and the second drain region 242. The third bitline contact 296c is in contact with the second bitline contact 296b through the third interlayer dielectric 290 and the third drain region 272. A bitline 298 is provided on the third interlayer dielectric 290 to be connected to the bitline contact 296. The bitline 298 may be provided in a cross direction to the common source line CSL. In another embodiment of the present invention, integration density of a one transistor DRAM device may be enhanced by stacking the one transistor DRAM device. Moreover, since a source line is linearly provided to make a contact for each source region unrequired, the integration density may be further enhanced.

Figure 6:
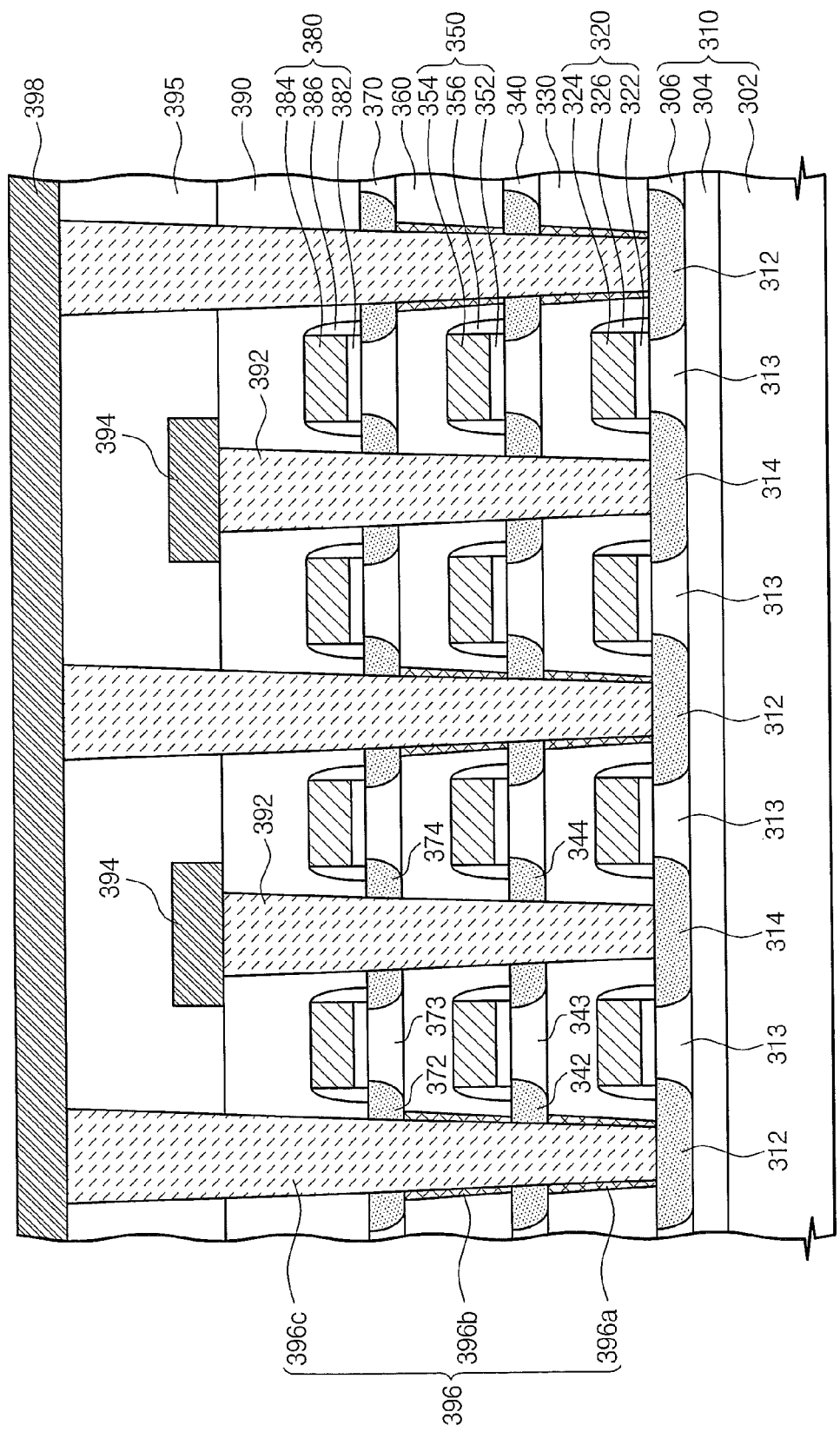
FIG. 6 is a cross-sectional view of a one transistor DRAM device according to a modified embodiment of the present invention.

FIG. 6 is a cross-sectional view of a one transistor DRAM device according to a modified embodiment of the present invention. Referring to FIG. 6, a semiconductor substrate 310 is provided with a filling insulating layer 304. The semiconductor substrate 310 may be a silicon on insulator (SOI) substrate. The semiconductor substrate 310 may include a support substrate 302 and a first semiconductor layer 306 on the filling insulating layer 304. A first source region 314 and a drain region 312 are provided in the first semiconductor layer 306 to be in contact with the filling insulating layer 304. A first floating body 313 is provided between the first source region 314 and the first drain region 312. A first gate pattern 320 is provided to cover the first floating body 313. The first gate pattern 320 may include a first gate insulator 322, a first gate electrode 324, and a first spacer 326. A first interlayer dielectric 330 is provided to cover the first gate pattern 320.

A second semiconductor layer 340 is provided on the first interlayer dielectric 330. Similar to the first semiconductor layer 306, the second semiconductor layer 340 may include a second source region 344, a second drain region 342, and a second floating body 343. A second gate pattern 350 is provided to cover the second floating body 343. The second gate pattern 350 may include a second gate insulator 352, a second gate electrode 354, and a second spacer 356. A second interlayer dielectric 360 is provided to cover the second gate pattern 350. A third semiconductor layer 370 is provided on the second interlayer dielectric 360. The third semiconductor layer 370 may include a third source region 374, a third drain region 372, and a third floating body 373. A third gate pattern 380 is provided to cover the third floating body 373. The third gate pattern 380 may include a third gate insulator 382, a third gate electrode 384, and a third spacer 386. A third interlayer dielectric 390 is provided to cover the third gate pattern 380.

A source line contact 392 is provided through the third interlayer dielectric 390, the second interlayer dielectric 360, and the first interlayer dielectric 330 to connect the third source region 374, the second source region 344, and the first source region 314. A source line 394 is provided on the third interlayer dielectric 390 to be connected to the source line contact 392. A fourth interlayer dielectric 395 is provided to cover the source line 394. A bitline contact 396 is provided through the fourth interlayer dielectric 395, the third interlayer dielectric 390, the second interlayer dielectric 360, and the first interlayer dielectric 330 to connect the first drain region 312, the second drain region 342, and the third drain region 372.

The bitline contact 396 may include a first bitline contact 396a, a second bitline contact 396b, and a third bitline contact 396c. The first bitline contact 396a is in contact with the first drain region 312 through the first interlayer dielectric 330. The second bitline contact 396b penetrates the second interlayer dielectric 360. The third bitline contact 396c penetrates the fourth interlayer dielectric 395, the third interlayer dielectric 390, the third drain region 372, the second bitline contact 396b, the second drain region 342, and the first bitline contact 396a to be in contact with the first drain region 312. A bitline 398 is provided on the fourth interlayer dielectric 395 to be connected to the bitline contact 396. The bitline 398 may be provided in a cross direction to the source line 394. In a modified embodiment of the present invention, integration density of a one transistor DRAM device may be enhanced by stacking the one transistor DRAM device.

Figure 7:
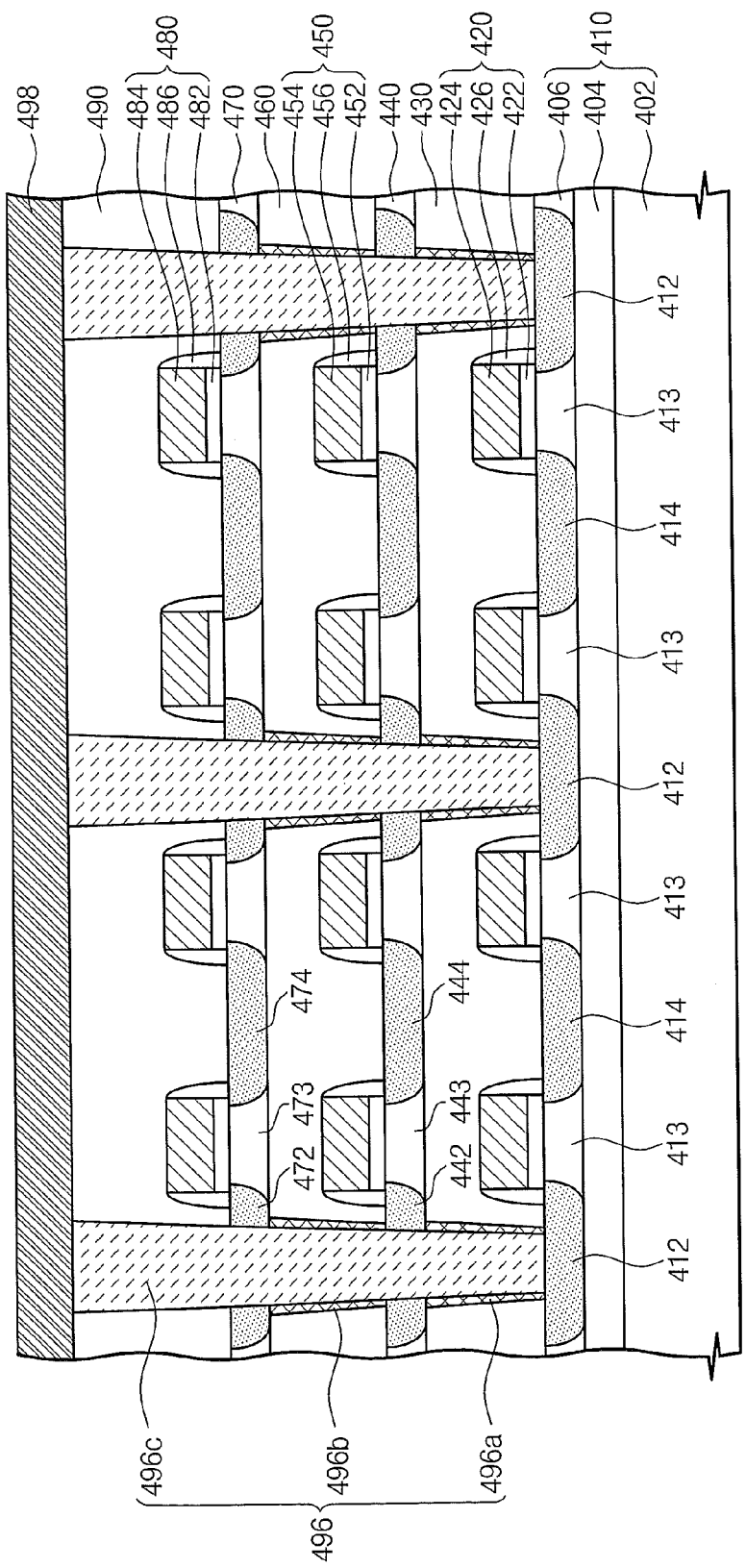
FIG. 7 is a cross-sectional view of a one transistor DRAM device according to another modified embodiment of the present invention.

FIG. 7 is a cross-sectional view of a one transistor DRAM device according to another modified embodiment of the present invention. Referring to FIG. 7, a semiconductor substrate 410 is provided with a filling insulating layer 404. The semiconductor substrate 410 may be a silicon on insulator (SOI) substrate. The semiconductor substrate 410 may include a support substrate 402 and a first semiconductor layer 406 on the filling insulating layer 404. A first source region 414 and a drain region 412 are provided in the first semiconductor layer 406 to be in contact with the filling insulating layer 404. A first floating body 413 is provided between the first source region 414 and the first drain region 412. A first gate pattern 420 is provided to cover the first floating body 413. The first gate pattern 420 may include a first gate insulator 422, a first gate electrode 424, and a first spacer 426. A first interlayer dielectric 430 is provided to cover the first gate pattern 420.

A second semiconductor layer 440 is provided on the first interlayer dielectric 430. Similar to the first semiconductor layer 406, the second semiconductor layer 440 may include a second source region 444, a second drain region 442, and a second floating body 443. A second gate pattern 450 is provided to cover the second floating body 443. The second gate pattern 450 may include a second gate insulator 452, a second gate electrode 454, and a second spacer 456. A second interlayer dielectric 460 is provided to cover the second gate pattern 450. A third semiconductor layer 470 is provided on the second interlayer dielectric 460. The third semiconductor layer 470 may include a third source region 474, a third drain region 472, and a third floating body 473. A third gate pattern 480 is provided to cover the third floating body 473.

The first source region 414, the second source region 444, and the third source region 474 are connected along an active region to exhibit a linear shape. The linear source regions 414, 444, and 474 may constitute common source lines CSL, which may be connected to a metal contact (not shown). The third gate pattern 480 may include a third gate insulator 482, a third gate electrode 484, and a third spacer 486. A third interlayer dielectric 490 is provided to cover the third gate pattern 480.

A bitline contact 496 is provided through the third interlayer dielectric 490, the second interlayer dielectric 460, and the first interlayer dielectric 430 to connect the first drain region 412, the second drain region 442, and the third drain region 472. The bitline contact 496 may include a first bitline contact 496a, a second bitline contact 496b, and a third bitline contact 496c. The first bitline contact 496a is in contact with the first drain region 412 through the first interlayer dielectric 430. The second bitline contact 496b penetrates the second interlayer dielectric 460. The third bitline contact 496c penetrates the third interlayer dielectric 490, the third drain region 472, the second bitline contact 496b, the second drain region 442, and the first bitline contact 496a to be in contact with the first drain region 412. A bitline 498 is provided on the third interlayer dielectric 490 to be connected to the bitline contact 496. The bitline 498 may be provided in a cross direction to the common source line CSL. In another modified embodiment of the present invention, integration density of a one transistor DRAM device may be enhanced by stacking the one transistor DRAM device. Moreover, since a source line is linearly provided to make a contact for each source region unrequired, the integration density may be further enhanced.

FIGS. 8A through 8D are cross-sectional views illustrating a method of forming one transistor DRAM device according to an embodiment of the present invention.

Figure 8A:
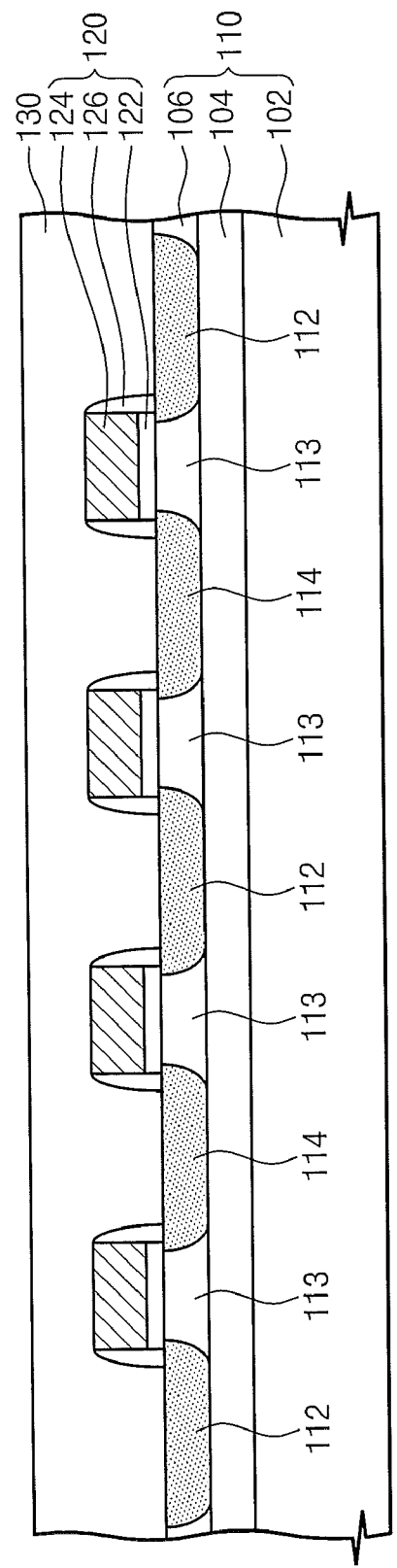
FIGS. 8A through 8D are cross-sectional views illustrating a method of forming one transistor DRAM device according to an embodiment of the present invention.

Referring to FIG. 8A, a semiconductor substrate 110 is prepared with a filling insulating layer 104. The semiconductor substrate 110 may be a silicon on insulator (SOI) substrate, which may be formed by means of separation by implanted oxygen (SIMOX). The semiconductor substrate 110 may include a support substrate 102 formed by the insulating layer 104 and a first semiconductor layer 106. A first gate pattern 120 is formed at the first semiconductor substrate 106.

The first gate pattern 120 may include a first gate insulator 122 on the first semiconductor substrate 106, a first gate electrode 124 on the first gate insulator 122, and a first spacer 126 on a sidewall of the first gate electrode 124. An ion implanting process is performed using the first gate pattern 120 as a mask to form a first source region 114 and a first drain region 112 in the first semiconductor layer 106. The first source region 114 and the first drain region 112 are in contact with the filling insulating layer 104. A first floating body 113 is formed between the first source region 114 and the first drain region 112. A first interlayer dielectric 130 is formed to cover the first gate pattern 120. The first interlayer dielectric 130 may include silicon oxide formed by means of chemical vapor deposition (CVD).

Figure 8B:
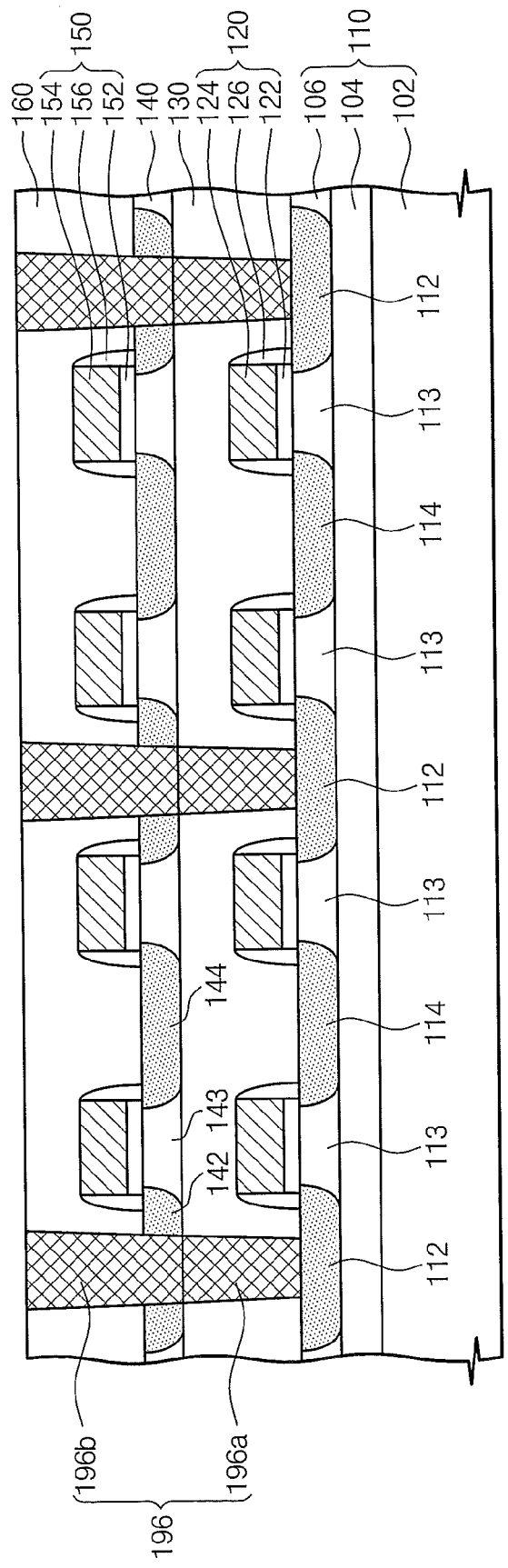

Referring to FIG. 8B, a first bitline contact 196a is formed through the first interlayer dielectric 130 to be in contact with the first drain region 112. The first bitline contact 196a may be grown selectively epitaxially from the first semiconductor layer 106.

A second semiconductor layer 140 is formed on the first interlayer dielectric 130. The formation of the second semiconductor layer 140 may include forming an amorphous silicon layer or a polysilicon layer on the first interlayer dielectric 130 to be in contact with the first bitline contact 196a and annealing the amorphous silicon layer or the polysilicon layer to be crystallized. A second gate pattern 150 is formed on the second semiconductor layer 140. The second gate pattern 150 may include a second gate insulator 152, a second gate electrode 154, and a second spacer 156.\

An ion implanting process is performed using the second gate pattern 150 as a mask to form a second source region 144 and a second drain region 142 in the second semiconductor layer 140. Further, a second floating body 143 is formed between the second source region 144 and the second drain region 142. A second interlayer dielectric 160 is formed to cover the second gate pattern 150. A second bitline contact 196b is formed through the second interlayer dielectric 160 and the second drain region 142 to be in contact with the first bitline contact 196a. The formation of the second bitline contact 196b may be done by means of selective epitaxial growth (SEG).

Figure 8C:
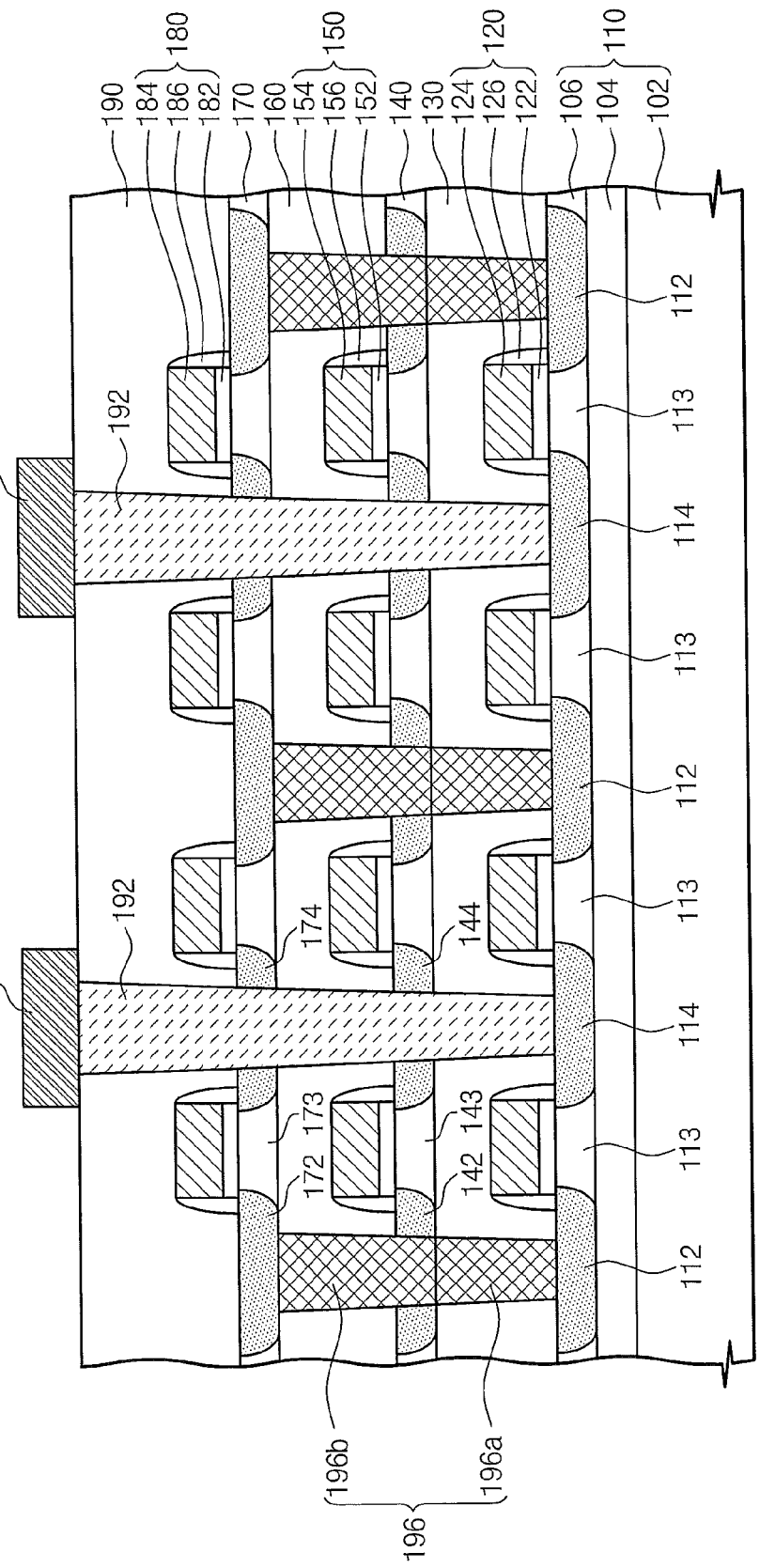

Referring to FIG. 8C, a third semiconductor layer 170 is formed on the second interlayer dielectric 160. The third semiconductor layer 170 may be formed by means of the same manner as the second semiconductor layer 140. A third gate pattern 180 is formed on the third semiconductor layer 170. The third gate pattern 180 may include a third gate insulator 182, a third gate electrode 184, and a third spacer 186. An ion implanting process is performed using the third gate pattern 180 as a mask to form a third source region 174 and a third drain region 172 in the third semiconductor layer 170. Further, a third floating body 173 is formed between the third source region 174 and the third drain region 172. A third interlayer dielectric 190 is formed to cover the third gate pattern 180.

A source line contact 192 is formed through the third interlayer dielectric 190, the second interlayer dielectric 160, and the first interlayer dielectric 130 to connect the third source region 174, the second source region 144, and the first source region 114. A source line 194 is formed on the third interlayer dielectric 190 to be connected to the source line contact 192. The source line 194 may be formed in a cross direction to a bitline that will be described below.

Figure 8D:
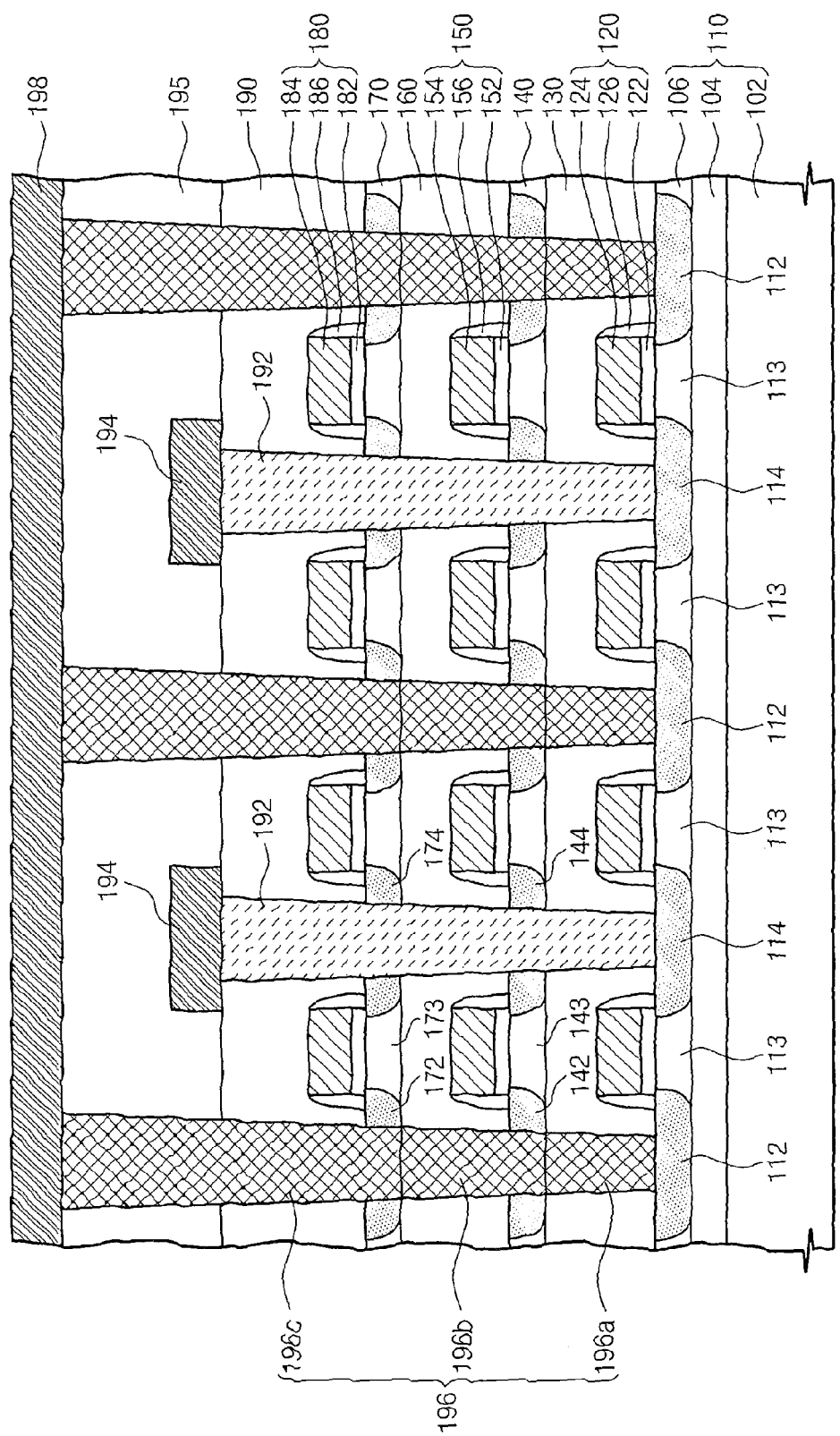

Referring to FIG. 8D, a fourth interlayer dielectric 195 is formed to cover the source line 194. A third bitline contact 196c is formed through the fourth interlayer dielectric 195, the third interlayer dielectric 190, and the third drain region 172 to be in contact with the second bitline contact 196b. Thus, the bitline contact 196 may include a first bitline contact 196a, a second bitline contact 196b, and a third bitline contact 196c. A bitline 198 is formed on the fourth interlayer dielectric 195 to be connected to the bitline contact 196. The bitline 198 may be formed in a cross direction to the source line 194.

Figure 9A:
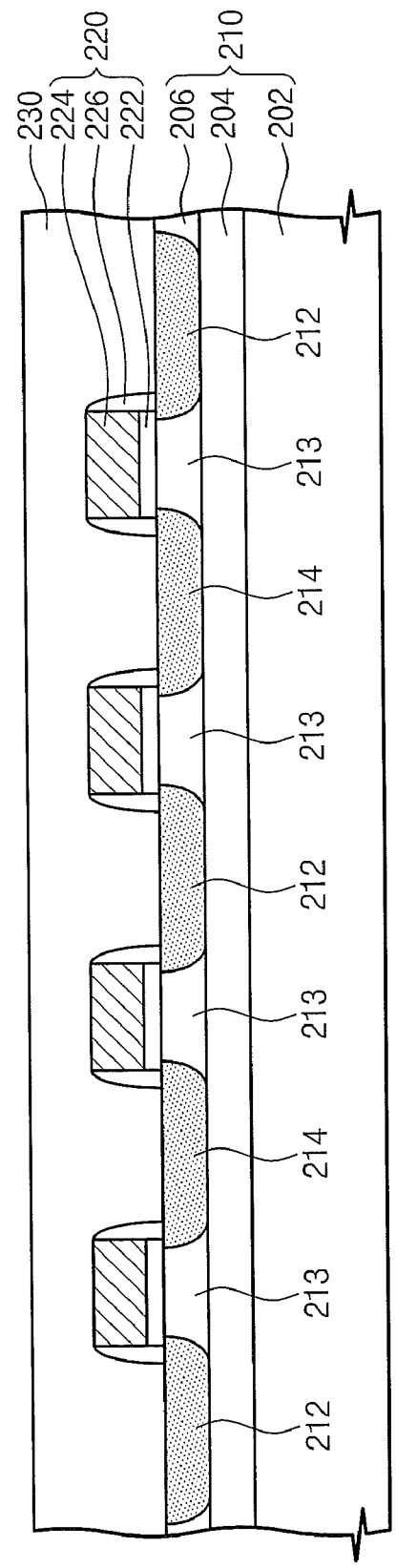
FIGS. 9A through 9C are cross-sectional views illustrating a method of forming one transistor DRAM device according to another embodiment of the present invention.
Figure 9B:
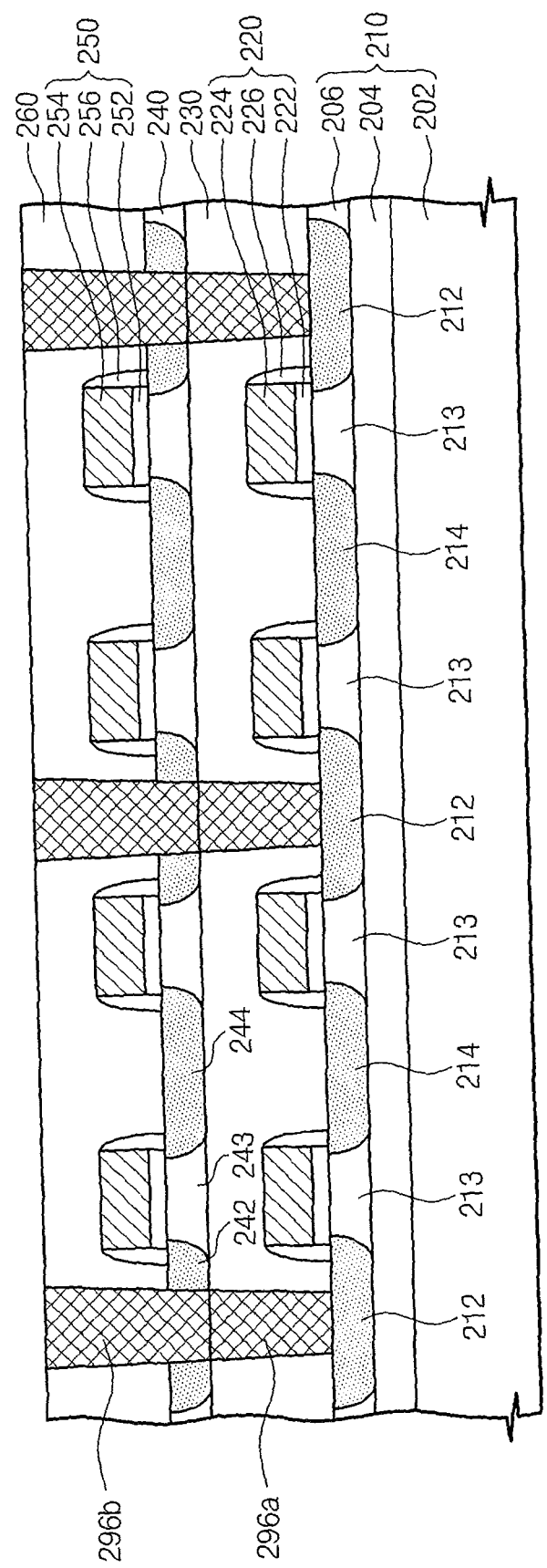
Figure 9C:
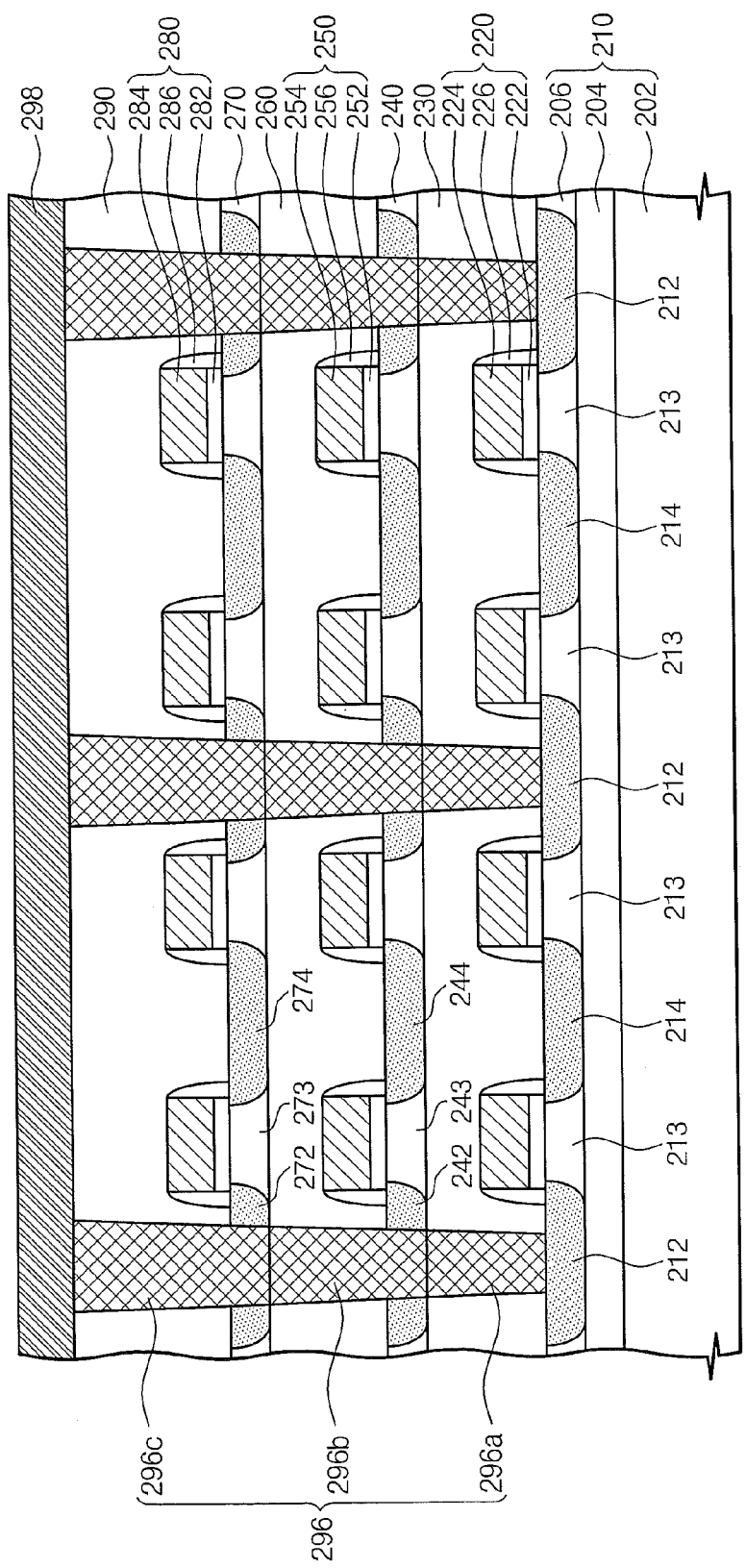

FIGS. 9A through 9C are cross-sectional views illustrating a method of forming one transistor DRAM device according to another embodiment of the present invention.

Referring to FIG. 9A, a semiconductor substrate 210 is prepared with a filling insulating layer 204. The semiconductor substrate 210 may be a silicon on insulator (SOI) substrate, which may be formed by means of separation by implanted oxygen (SIMOX). The semiconductor substrate 210 may include a support substrate 202 formed by the insulating layer 204 and a first semiconductor layer 206. A first gate pattern 220 is formed at the first semiconductor substrate 206.

The first gate pattern 220 may include a first gate insulator 222 on the first semiconductor substrate 206, a first gate electrode 224 on the first gate insulator 222, and a first spacer 226 on a sidewall of the first gate electrode 224. An ion implanting process is performed using the first gate pattern 220 as a mask to form a first source region 214 and a first drain region 212 in the first semiconductor layer 206. The first source region 214 and the first drain region 212 are in contact with the filling insulating layer 204. A first floating body 213 is formed between the first source region 214 and the first drain region 212. A first interlayer dielectric 230 is formed to cover the first gate pattern 220. The first interlayer dielectric 230 may include silicon oxide formed by means of chemical vapor deposition (CVD).

Referring to FIG. 9B, a first bitline contact 296a is formed through the first interlayer dielectric 230 to be connected to the first drain region 212. The first bitline contact 296a may be grown selectively epitaxially from the first semiconductor layer 206.

A second semiconductor layer 240 is formed on the first interlayer dielectric 230. The formation of the second semiconductor layer 240 may include forming an amorphous silicon layer or a polysilicon layer on the first interlayer dielectric 230 to be in contact with the first bitline contact 296a and annealing the amorphous silicon layer or the polysilicon layer to be crystallized. A second gate pattern 250 is formed on the second semiconductor layer 240. The second gate pattern 250 may include a second gate insulator 252, a second gate electrode 254, and a second spacer 256.

An ion implanting process is performed using the second gate pattern 250 as a mask to form a second source region 244 and a second drain region 242 in the second semiconductor layer 240. Further, a second floating body 243 is formed between the second source region 244 and the second drain region 242. A second interlayer dielectric 260 is formed to cover the second gate pattern 250. A second bitline contact 296b is formed through the second interlayer dielectric 260 and the second drain region 242 to be in contact with the first bitline contact 296a. The formation of the second bitline contact 296b may be done by means of selective epitaxial growth (SEG).

Referring to FIG. 9C, a third semiconductor layer 270 is formed on the second interlayer dielectric 260. The third semiconductor layer 270 may be formed by means of the same manner as the second semiconductor layer 240. A third gate pattern 280 is formed on the third semiconductor layer 270. The third gate pattern 280 may include a third gate insulator 282, a third gate electrode 284, and a third spacer 286. An ion implanting process is performed using the third gate pattern 280 as a mask to form a third source region 274 and a third drain region 272 in the third semiconductor layer 270. Further, a third floating body 273 is formed between the third source region 274 and the third drain region 272. A third interlayer dielectric 290 is formed to cover the third gate pattern 280.

The third source region 274, the second source region 244, and the first source region 214 are connected by an active region to exhibit a linear shape. The first, second, and third source regions 214, 244, and 274 may constitute common source lines CSL, which may be formed in a cross direction to a bitline that will be described below. The common source lines CSL may be connected to an external interconnection by one metal contact.

A third bitline contact 296c is formed through the third interlayer dielectric 290 and the third drain region 272 to be in contact with the second bitline contact 296b. Thus, a bitline contact 296 may include a first bitline contact 296a, a second bitline contact 296b, and a third bitline contact 296c. A bitline 298 is formed on the third interlayer dielectric 290 to be connected to the bitline contact 296. The bitline 298 may be formed in a cross direction to the common source line CSL. Due to the common source line CSL, integration density of a one transistor DRAM device may increase more.

FIGS. 10A through 10D are cross-sectional views illustrating a method of forming one transistor DRAM device according to a modified embodiment of the present invention.

Figure 10A:
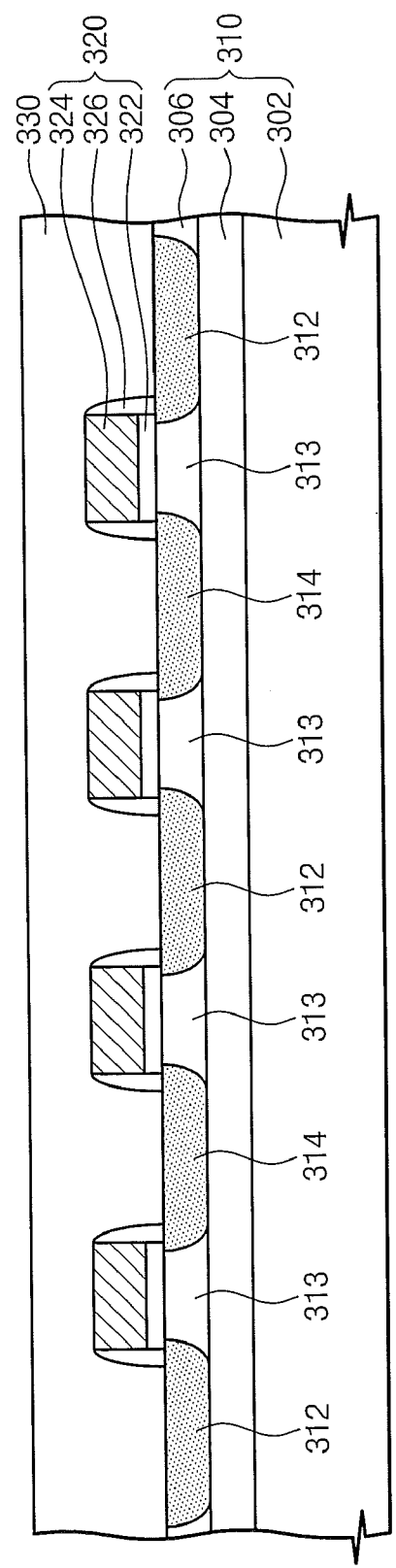

Referring to FIG. 10A, a semiconductor substrate 310 is prepared with a filling insulating layer 304. The semiconductor substrate 310 may be a silicon on insulator (SOI) substrate, which may be formed by means of separation by implanted oxygen (SIMOX). The semiconductor substrate 310 may include a support substrate 302 formed by the insulating layer 304 and a first semiconductor layer 306. A first gate pattern 320 is formed at the first semiconductor substrate 306.

The first gate pattern 320 may include a first gate insulator 322 on the first semiconductor substrate 306, a first gate electrode 324 on the first gate insulator 322, and a first spacer 326 on a sidewall of the first gate electrode 324. An ion implanting process is performed using the first gate pattern 320 as a mask to form a first source region 314 and a first drain region 312 in the first semiconductor layer 306. The first source region 314 and the first drain region 312 are in contact with the filling insulating layer 304. A first floating body 313 is formed between the first source region 314 and the first drain region 312. A first interlayer dielectric 330 is formed to cover the first gate pattern 320. The first interlayer dielectric 330 may include silicon oxide formed by means of chemical vapor deposition (CVD).

Figure 10B:
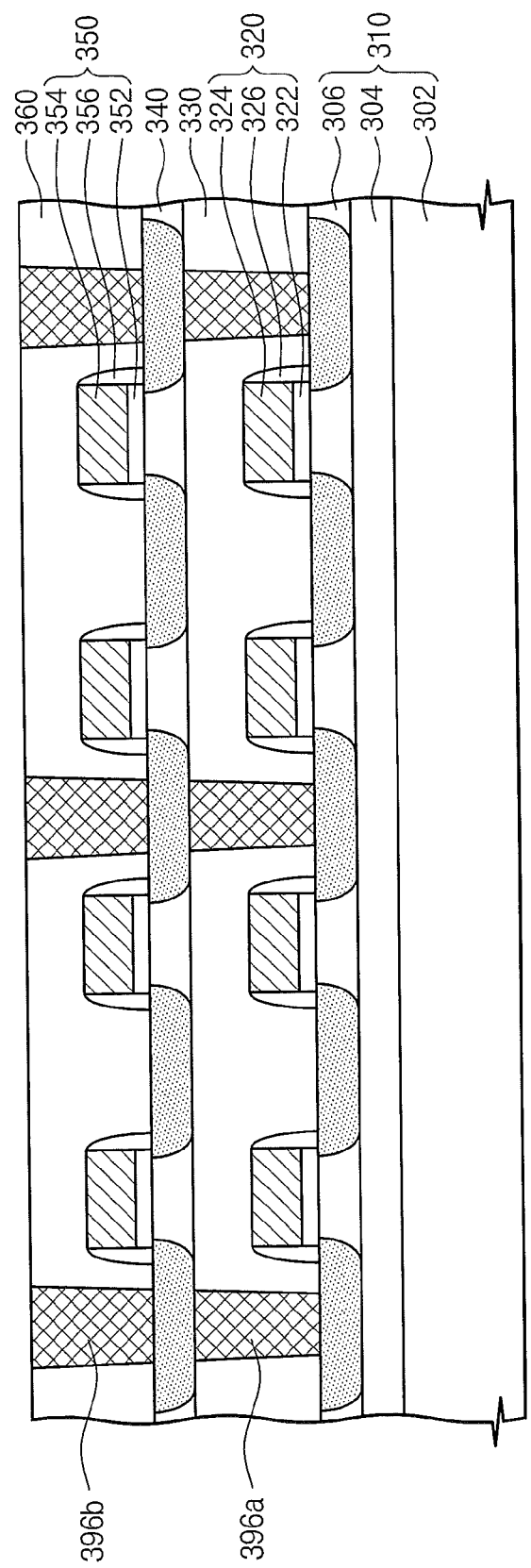

Referring to FIG. 10B, a first bitline contact 396a is formed through the first interlayer dielectric 330 to be connected to the first drain region 312. The first bitline contact 396a may be grown selectively epitaxially from the first semiconductor layer 306.

A second semiconductor layer 340 is formed on the first interlayer dielectric 330. The formation of the second semiconductor layer 340 may include forming an amorphous silicon layer or a polysilicon layer on the first interlayer dielectric 330 to be in contact with the first bitline contact 396a and annealing the amorphous silicon layer or the polysilicon layer to be crystallized. A second gate pattern 350 is formed on the second semiconductor layer 340. The second gate pattern 350 may include a second gate insulator 352, a second gate electrode 354, and a second spacer 356.

An ion implanting process is performed using the second gate pattern 350 as a mask to form a second source region 344 and a second drain region 342 in the second semiconductor layer 340. Further, a second floating body 343 is formed between the second source region 344 and the second drain region 342. A second interlayer dielectric 360 is formed to cover the second gate pattern 350. A second bitline contact 396b is formed through the second interlayer dielectric 360 and the second 342 to be in contact with the first bitline contact 396a. The formation of the second bitline contact 396b may be done by means of selective epitaxial growth (SEG).

Referring to FIG. 10C, a third semiconductor layer 370 is formed on the second interlayer dielectric 360. The third semiconductor layer 370 may be formed by means of the same manner as the second semiconductor layer 340. A third gate pattern 380 is formed on the third semiconductor layer 370. The third gate pattern 380 may include a third gate insulator 382, a third gate electrode 384, and a third spacer 386. An ion implanting process is performed using the third gate pattern 380 as a mask to form a third source region 374 and a third drain region 372 in the third semiconductor layer 370. Further, a third floating body 373 is formed between the third source region 374 and the third drain region 372. A third interlayer dielectric 390 is formed to cover the third gate pattern 380.

A source line contact 392 is formed through the third interlayer dielectric 390, the second interlayer dielectric 360, and the first interlayer dielectric 330 to be connected to the third source region 374, the second source region 344, and the first source region 314. A source line 394 is formed on the third interlayer dielectric 390 to be connected to the source line contact 392. The source line 394 may be formed in a cross direction to a bitline that will be described below.

Figure 10D:
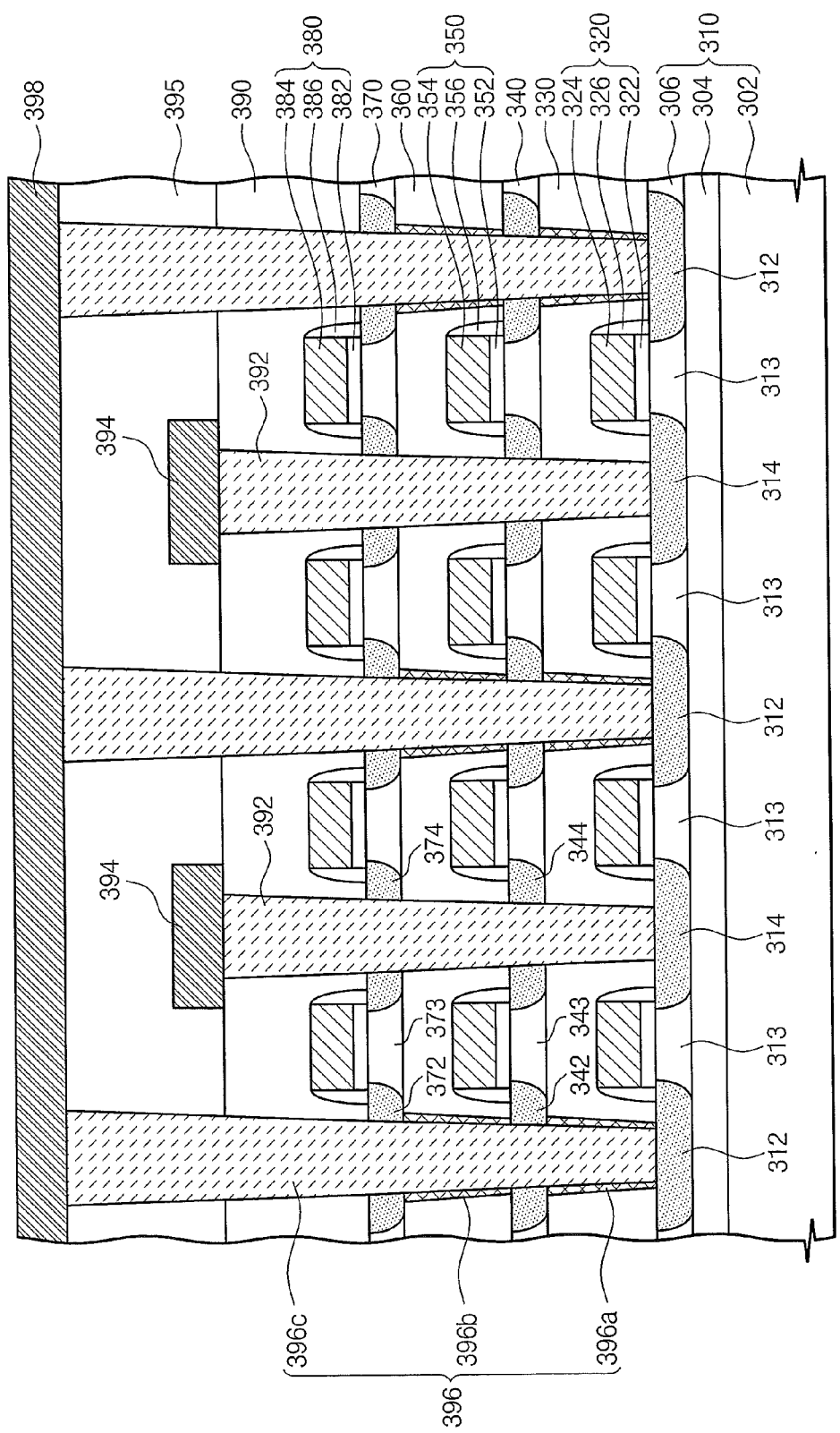

Referring to FIG. 10D a fourth interlayer dielectric 395 is formed to cover the source line 394. A third bitline contact 396c is formed through the fourth interlayer dielectric 395, the third interlayer dielectric 390, the second bitline contact 396b, the first bitline contact 396a, the third drain region 372, and the second drain region 342 to be in contact with the first drain region 312. Thus, the bitline contact 396 may include a first bitline contact 396a, a second bitline contact 396b, and a third bitline contact 396c. A bitline 398 is formed on the fourth interlayer dielectric 395 to be connected to the third bitline contact 396c. The bitline 398 may be formed in a cross direction to the source line 394 FIGS. 11A through 11D are cross-sectional views illustrating a method of forming one transistor DRAM device according to another modified embodiment of the present invention.

Figure 11A:
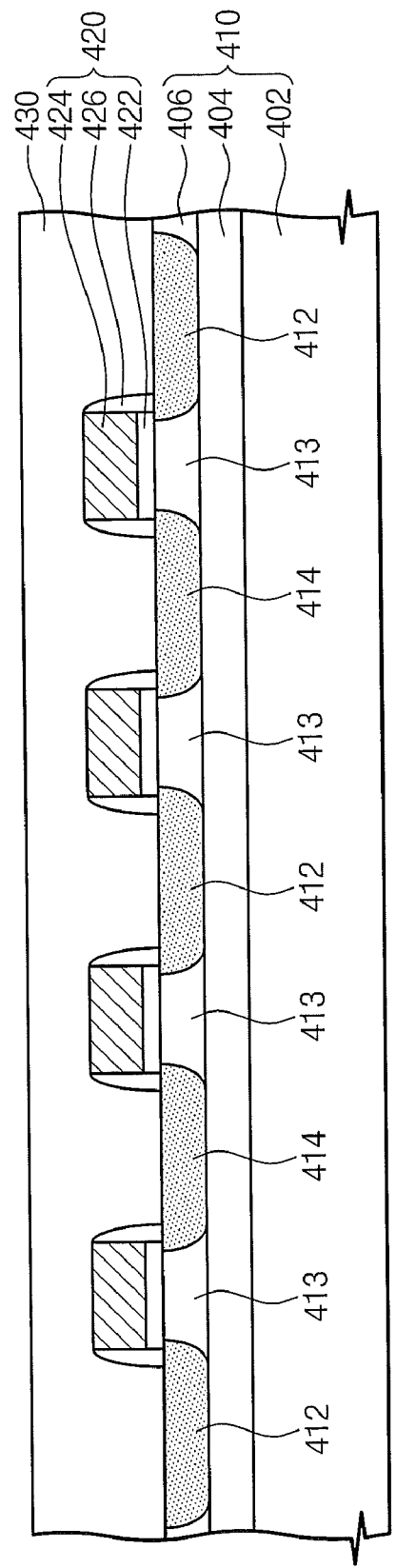
FIGS. 11A through 11C are cross-sectional views illustrating a method of forming one transistor DRAM device according to another modified embodiment of the present invention.

Referring to FIG. 11A, a semiconductor substrate 410 is prepared with a filling insulating layer 404. The semiconductor substrate 410 may be a silicon on insulator (SOI) substrate, which may be formed by means of separation by implanted oxygen (SIMOX). The semiconductor substrate 410 may include a support substrate 402 formed by the insulating layer 404 and a first semiconductor layer 406. A first gate pattern 420 is formed at the first semiconductor substrate 406.

The first gate pattern 420 may include a first gate insulator 422 on the first semiconductor substrate 406, a first gate electrode 424 on the first gate insulator 422, and a first spacer 426 on a sidewall of the first gate electrode 424. An ion implanting process is performed using the first gate pattern 420 as a mask to form a first source region 414 and a first drain region 412 in the first semiconductor layer 406. The first source region 414 and the first drain region 412 are in contact with the filling insulating layer 404. A first floating body 413 is formed between the first source region 414 and the first drain region 412. A first interlayer dielectric 430 is formed to cover the first gate pattern 420. The first interlayer dielectric 430 may include silicon oxide formed by means of chemical vapor deposition (CVD).

Figure 11B:
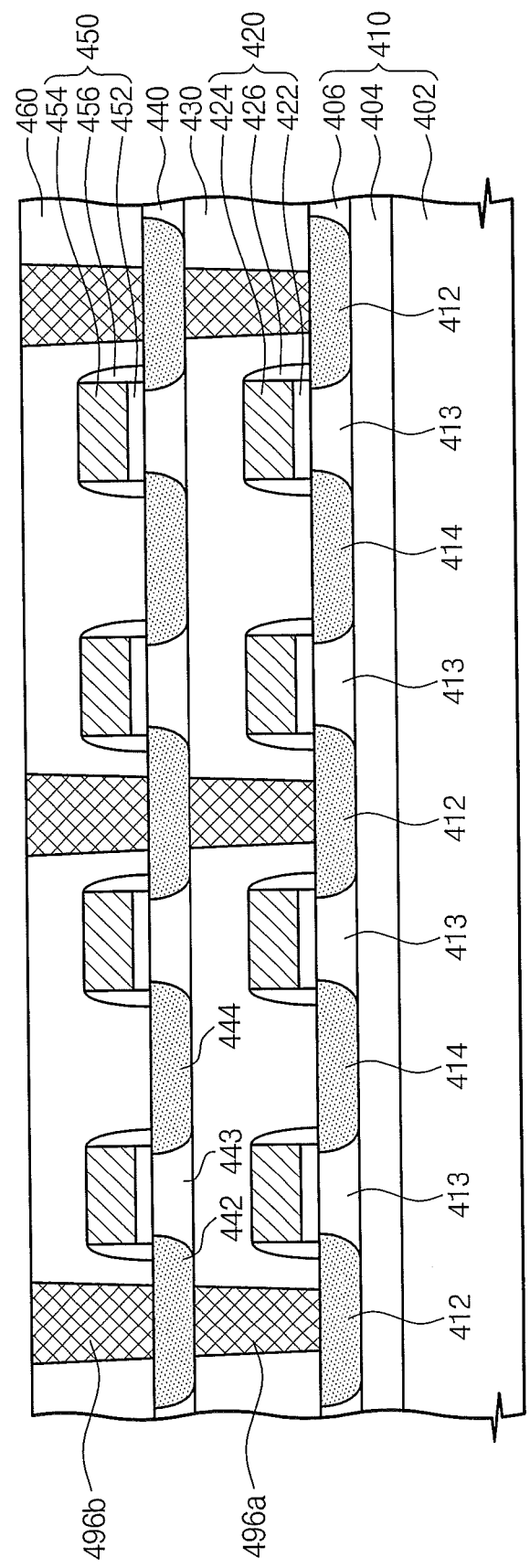

Referring to FIG. 11B, a first bitline contact 496a is formed through the first interlayer dielectric 430 to be connected to the first drain region 412. The first bitline contact 496a may be grown selectively epitaxially from the first semiconductor layer 406.

A second semiconductor layer 440 is formed on the first interlayer dielectric 430. The formation of the second semiconductor layer 440 may include forming an amorphous silicon layer or a polysilicon layer on the first interlayer dielectric 430 to be in contact with the first bitline contact 496a and annealing the amorphous silicon layer or the polysilicon layer to be crystallized. A second gate pattern 450 is formed on the second semiconductor layer 440. The second gate pattern 450 may include a second gate insulator 452, a second gate electrode 454, and a second spacer 456.

An ion implanting process is performed using the second gate pattern 450 as a mask to form a second source region 444 and a second drain region 442 in the second semiconductor layer 440. Further, a second floating body 443 is formed between the second source region 444 and the second drain region 442. A second interlayer dielectric 460 is formed to cover the second gate pattern 450. A second bitline contact 496b is formed through the second interlayer dielectric 460 to be in contact with the second drain region 442. The formation of the second bitline contact 496b may be done by means of selective epitaxial growth (SEG).

Figure 11C:
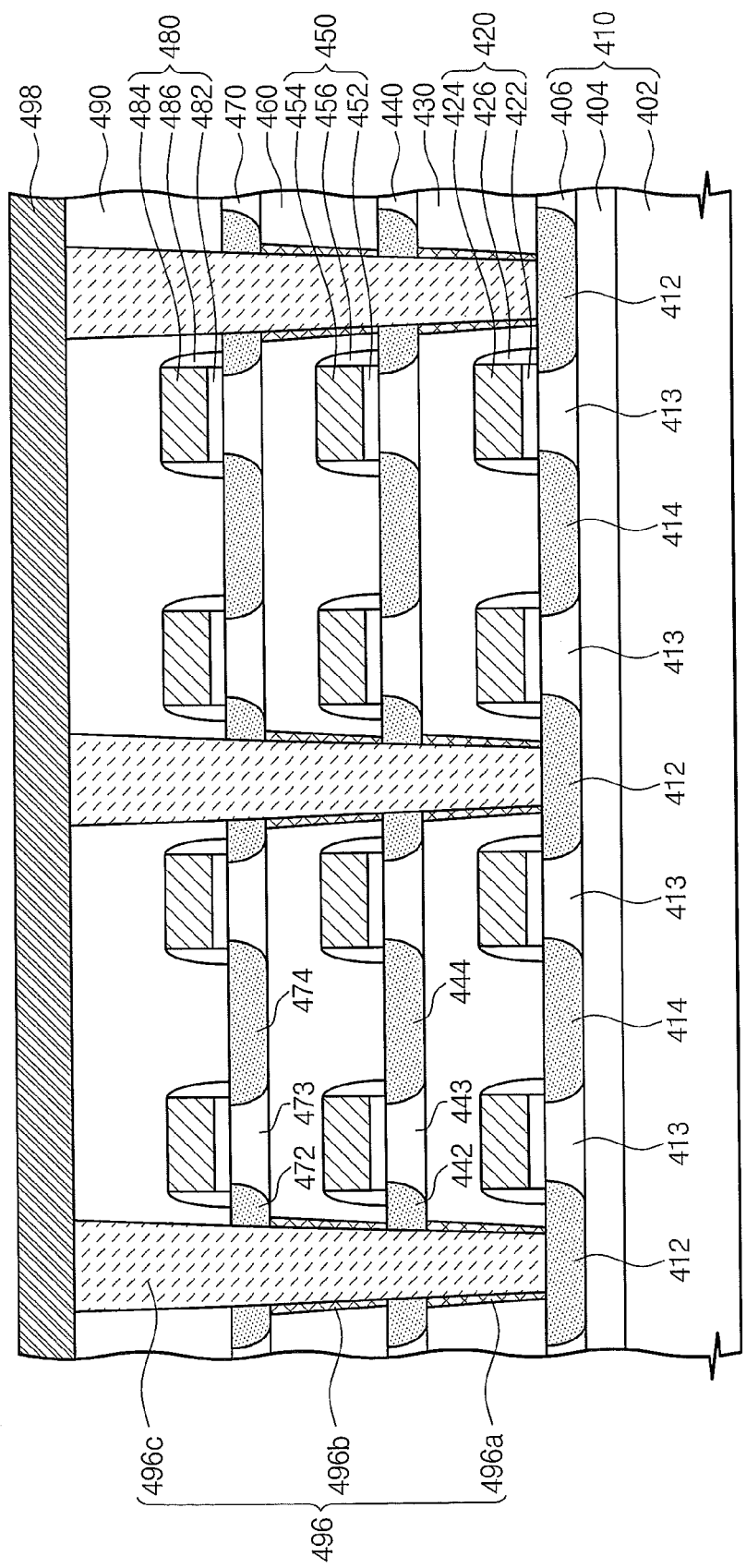

Referring to FIG. 11C, a third semiconductor layer 470 is formed on the second interlayer dielectric 460. The third semiconductor layer 470 may be formed by means of the same manner as the second semiconductor layer 440. A third gate pattern 480 is formed on the third semiconductor layer 470. The third gate pattern 280 may include a third gate insulator 482, a third gate electrode 484, and a third spacer 486. An ion implanting process is performed using the third gate pattern 480 as a mask to form a third source region 474 and a third drain region 472 in the third semiconductor layer 470. Further, a third floating body 473 is formed between the third source region 474 and the third drain region 472. A third interlayer dielectric 490 is formed to cover the third gate pattern 480.

The third source region 474, the second source region 444, and the first source region 414 are each connected by an active region to exhibit a linear shape. The first, second, and third source regions 414, 444, 474 may constitute common source lines CSL, which may be formed in a cross direction to a bitline that will be described below. The common source lines CSL may be connected to an external interconnection by one metal contact.

A third bitline contact 496c is formed through the third interlayer dielectric 490, the third drain region 472, the second drain region 442, the second bitline contact 496b, and the first bitline contact 496a. Thus, a bitline contact 496 may include a first bitline contact 496a, a second bitline contact 496b, and a third bitline contact 496c. A bitline 498 is formed on the third interlayer dielectric 490 to be connected to the bitline contact 496c. The bitline 498 may be formed in a cross direction to the common source line CSL. Due to the common source line CSL, integration density of a one transistor DRAM device may increase more.

To sum up, a one transistor DRAM device is stacked to enhance integration density thereof. Further, a common source line makes integration density of the one transistor DRAM device increased more.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A method of forming a one transistor DRAM device, comprising:
preparing a substrate with an insulating layer and a first semiconductor layer;
forming a first gate pattern on the first semiconductor layer;
forming a first source region and a first drain region and a first floating body in the first semiconductor layer adjacent to the first gate pattern, the first source region and the first drain region being in contact with the insulating layer and the first floating body being between the first source region and the first drain region;
forming a first interlayer dielectric to cover the first gate pattern;
forming a second semiconductor layer on the first interlayer dielectric;
forming a second gate pattern on the second semiconductor layer;
forming a second source region and a second drain region and a second floating body in the second semiconductor layer adjacent to the second gate pattern, the second source region and the second drain region being in contact with the first interlayer dielectric and the second floating body being between the second source region and the second drain region;

forming a second interlayer dielectric to cover the second gate pattern;

forming a bitline contact to penetrate the second interlayer dielectric and the first interlayer dielectric and electrically connect the first drain region to the second drain region; and forming a source line contact to penetrate the second interlayer dielectric and the first interlayer dielectric and electrically connect the first source region to the second source region;

wherein the first gate pattern and the second gate pattern are formed on the first floating body and the second floating body, respectively, and are independently controllable.

2. The method as set forth in claim 1, wherein the forming a bitline contact comprises:

forming a first bitline contact to penetrate the first interlayer dielectric and be in contact with the first drain region; and forming a second bitline contact to penetrate the second drain region and the second interlayer dielectric and be in contact with the first bitline contact, wherein the forming a first bitline contact is done by means of selective epitaxial growth (SEG).

3. The method as set forth in claim 2, wherein the forming a second semiconductor layer comprises:

forming an amorphous or polysilicon layer on the first interlayer dielectric to be in contact with the first bitline contact; and annealing the amorphous or polysilicon layer to be crystallized.

4. The method as set forth in claim 1, further comprising:
forming a bitline on the second interlayer dielectric to be connected to the bitline contact.

5. The method as set forth in claim 1, further comprising:
forming a third interlayer dielectric on the second interlayer dielectric; and forming a bitline contact to penetrate the third interlayer dielectric, the second interlayer dielectric, and the first interlayer dielectric and electrically connect the first drain region and the second drain region.

6. The method as set forth in claim 5, further comprising:
forming a bitline on the third interlayer dielectric to be connected to the bitline contact; and forming a source line on the second interlayer dielectric to cross the bitline and be connected to the source line contact.

7. A method of forming a one transistor DRAM device, comprising:

forming a substrate with an insulating layer;

forming a first semiconductor layer provided on the insulating layer and including a first source region and a first drain region which are in contact with the insulating layer and a first floating body between the first source region and the first drain region;

forming a first gate pattern of a first memory cell, which covers the first floating body;

forming a first interlayer dielectric to cover the first gate pattern;

forming a second semiconductor layer provided on the first interlayer dielectric and including a second source region and a second drain region which are in contact with the first interlayer dielectric and a second floating body between the second source region and the second drain region;

forming a second gate pattern of a second memory cell that is independently controllable relative to the first memory cell, which covers the second floating body;

forming a second interlayer dielectric to cover the second gate pattern;

forming a bitline contact to penetrate the second interlayer dielectric and the first interlayer dielectric and electrically connect the first drain region to the second drain region;

forming a source line contact to penetrate the second interlayer dielectric and the first interlayer dielectric and electrically connect the first source region to the second source region; and forming a bitline on the second interlayer dielectric, the bitline being connected to the bitline contact;

wherein the first source region and the second source region cross the bitline to exhibit a linear shape.

* * * * *